(12) United States Patent
Brandl

(10) Patent No.: US 11,722,136 B2
(45) Date of Patent: Aug. 8, 2023

(54) SENSOR SYSTEMS, SWITCHED-MODE POWER SUPPLY, AND ELECTRONIC DEVICES

(71) Applicant: Infineon Technologies AG, Neubiberg (DE)

(72) Inventor: Matthias Brandl, Munich (DE)

(73) Assignee: Infineon Technologies AG, Neubiberg (DE)

( * ) Notice: Subject to any disclaimer, the term of this patent is extended or adjusted under 35 U.S.C. 154(b) by 263 days.

(21) Appl. No.: 17/023,933

(22) Filed: Sep. 17, 2020

(65) Prior Publication Data

US 2021/0091652 A1    Mar. 25, 2021

(30) Foreign Application Priority Data

Sep. 25, 2019  (EP) .................................... 19199538

(51) Int. Cl.
| | | |
|---|---|---|
| *H03K 17/945* | (2006.01) | |
| *G01S 7/02* | (2006.01) | |
| *G01S 13/02* | (2006.01) | |
| *H02M 3/335* | (2006.01) | |

(52) U.S. Cl.
CPC .............. *H03K 17/945* (2013.01); *G01S 7/02* (2013.01); *G01S 13/02* (2013.01); *H02M 3/335* (2013.01)

(58) Field of Classification Search
None
See application file for complete search history.

(56) References Cited

U.S. PATENT DOCUMENTS

2019/0131788 A1\*  5/2019  Hamard ............... H03K 17/945
2019/0310296 A1   10/2019  Cheng et al.

FOREIGN PATENT DOCUMENTS

| CN | 108414959 A | 8/2018 |
|---|---|---|
| EP | 1768239 A2 | 3/2007 |
| EP | 3477337 A1 | 5/2019 |
| JP | 4778258 B2 | 9/2011 |
| WO | 2015105924 A1 | 7/2015 |

OTHER PUBLICATIONS

JP4778258B2 translation (Year: 2011).\*
EP Extended Search Report, EP 19199538.0, dated Apr. 17, 2020, pp. 1-53.

\* cited by examiner

*Primary Examiner* — Whitney Moore
(74) *Attorney, Agent, or Firm* — Armis IP Law, LLC

(57) ABSTRACT

A sensor system is provided. The sensor system includes a sensor capable of measuring a physical quantity. Further, the sensor system includes a capacitive device for storing electrical energy. The capacitive device is coupled to the sensor. Additionally, the sensor system includes a power supply input for connecting the sensor system to a switched-mode power supply, and a switch circuit capable of selectively connecting the capacitive device to the power supply input. The sensor system includes a control circuit configured to control the switch circuit to connect the capacitive device to the power supply input while the sensor is not measuring the physical quantity in order to charge the capacitive device. The control circuit is further configured to control the switch circuit to disconnect the capacitive device from the power supply input while the sensor is measuring the physical quantity in order to exclusively power the sensor by the capacitive device.

23 Claims, 7 Drawing Sheets

SENSOR SYSTEMS, SWITCHED-MODE POWER SUPPLY, AND ELECTRONIC DEVICES

RELATED APPLICATION

This application claims priority to earlier filed European Patent Application Serial Number EP1919 9538 entitled "SENSOR SYSTEMS, SWITCHED-MODE POWER SUPPLY, AND ELECTRONIC DEVICES," filed on Sep. 25, 2019, the entire teachings of which are incorporated herein by this reference.

FIELD

The present disclosure relates to smart power supply for sensors. In particular, examples relate to sensor systems, a Switched-Mode Power Supply (SMPS) and electronic devices.

BACKGROUND

Modern electronic devices use a variety of sensors for measuring various physical quantities. For example, some electronic devices use a radar sensor for measuring a distance or a velocity. Radar sensors in consumer electronics should be as cheap as possible. However, radar sensors demand for a low noise voltage supply. Furthermore, mobile applications demand for high power efficiency.

Conventional power supplies take the voltage of a SMPS and use a Low-Dropout (LDO) regulator to generate a voltage that has low noise and is decoupled from the noise of the SMPS. On the one hand, an SMPS generates too much noise for common sensors so that it cannot be used for directly powering a sensor. On the other hand, LDO regulators are not power efficient.

BRIEF DESCRIPTION OF EMBODIMENTS

Hence, there may be a demand for an improved power supply for a sensor.

The demand may be satisfied by the subject matter of the appended claims.

An example relates to a sensor system. The sensor system comprises a sensor capable of measuring a physical quantity. Further, the sensor system comprises a capacitive device for storing electrical energy. The capacitive device is coupled to the sensor. Additionally, the sensor system comprises a power supply input for connecting the sensor system to a SMPS, and a switch circuit capable of selectively connecting the capacitive device to the power supply input. The sensor system comprises a control circuit operative to control the switch circuit to connect the capacitive device to the power supply input while the sensor is not measuring the physical quantity in order to charge the capacitive device. The control circuit is further operative to control the switch circuit to disconnect the capacitive device from the power supply input while the sensor is measuring the physical quantity in order to exclusively power the sensor by the capacitive device while the sensor is measuring the physical quantity.

Another example relates to a method for operating a sensor system comprising a sensor capable of measuring a physical quantity, a capacitive device for storing electrical energy that is coupled to the sensor, a power supply input for connecting the sensor system to a SMPS, and a switch circuit capable of selectively connecting the capacitive device to the power supply input. The method comprises controlling the switch circuit to connect the capacitive device to the power supply input while the sensor is not measuring the physical quantity in order to charge the capacitive device. Additionally, the method comprises controlling the switch circuit to disconnect the capacitive device from the power supply input while the sensor is measuring the physical quantity in order to exclusively power the sensor by the capacitive device while the sensor is measuring the physical quantity.

A further example relates to an electronic device comprising a sensor system as described herein, and a SMPS connected to the power supply input of the sensor system.

An example relates to a SMPS for a sensor. The SMPS comprises a power supply output for connecting to the sensor and providing electrical energy to the sensor. Further, the SMPS comprises a capacitive device capable of storing electrical energy. The capacitive device is coupled to the power supply output. Additionally, the SMPS comprises power circuitry including a switching regulator for providing DC power. The SMPS comprises a switch circuit capable of selectively connecting the capacitive device to the power circuitry. In addition, the SMPS comprises a control circuit operative to receive a status signal indicating whether the sensor is measuring a physical quantity. If the status signal indicates that the sensor is not measuring the physical quantity, the control circuit is operative to control the switch circuit to connect the capacitive device to the power circuitry in order to charge the capacitive device. If the status signal indicates that the sensor is measuring the physical quantity, the control circuit is operative to control the switch circuit to disconnect the capacitive device from the power circuitry such that the electrical energy provided by the power supply output to the sensor originates exclusively from the capacitive device while the sensor is measuring the physical quantity.

Another example relates to a method for operating a SMPS for a sensor, wherein the SMPS comprises a power supply output for connecting to the sensor and providing electrical energy to the sensor, a capacitive device capable of storing electrical energy, the capacitive device being coupled to the power supply output, power circuitry including a switching regulator for providing DC power, and a switch circuit capable of selectively connecting the capacitive device to the power circuitry. The method comprises receiving a status signal indicating whether the sensor is measuring a physical quantity. Further, if the status signal indicates that the sensor is not measuring the physical quantity, the method comprises controlling the switch circuit to connect the capacitive device to the power circuitry in order to charge the capacitive device. If the status signal indicates that the sensor is measuring the physical quantity, the method comprises controlling the switch circuit to disconnect the capacitive device from the power circuitry such that electrical energy provided by the power supply output to the sensor originates exclusively from the capacitive device while the sensor is measuring the physical quantity.

A further example relates to a sensor system comprising a SMPS as described herein, and a sensor capable of measuring a physical quantity, wherein the sensor is connected to the power supply output.

A still further example relates to an electronic device comprising a SMPS as described herein, and a sensor capable of measuring a physical quantity, wherein the sensor is connected to the power supply output.

BRIEF DESCRIPTION OF THE FIGURES

Some examples of apparatuses and/or methods will be described in the following by way of example only, and with reference to the accompanying figures, in which.

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Same or like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled via one or more intervening elements. If two elements A and B are combined using an "or", this is to be understood to disclose all possible combinations, i.e. only A, only B as well as A and B, if not explicitly or implicitly defined otherwise. An alternative wording for the same combinations is "at least one of A and B" or "A and/or B". The same applies, mutatis mutandis, for combinations of more than two Elements.

The terminology used herein for the purpose of describing particular examples is not intended to be limiting for further examples. Whenever a singular form such as "a", "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises", "comprising", "includes" and/or "including", when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

Figure 1:
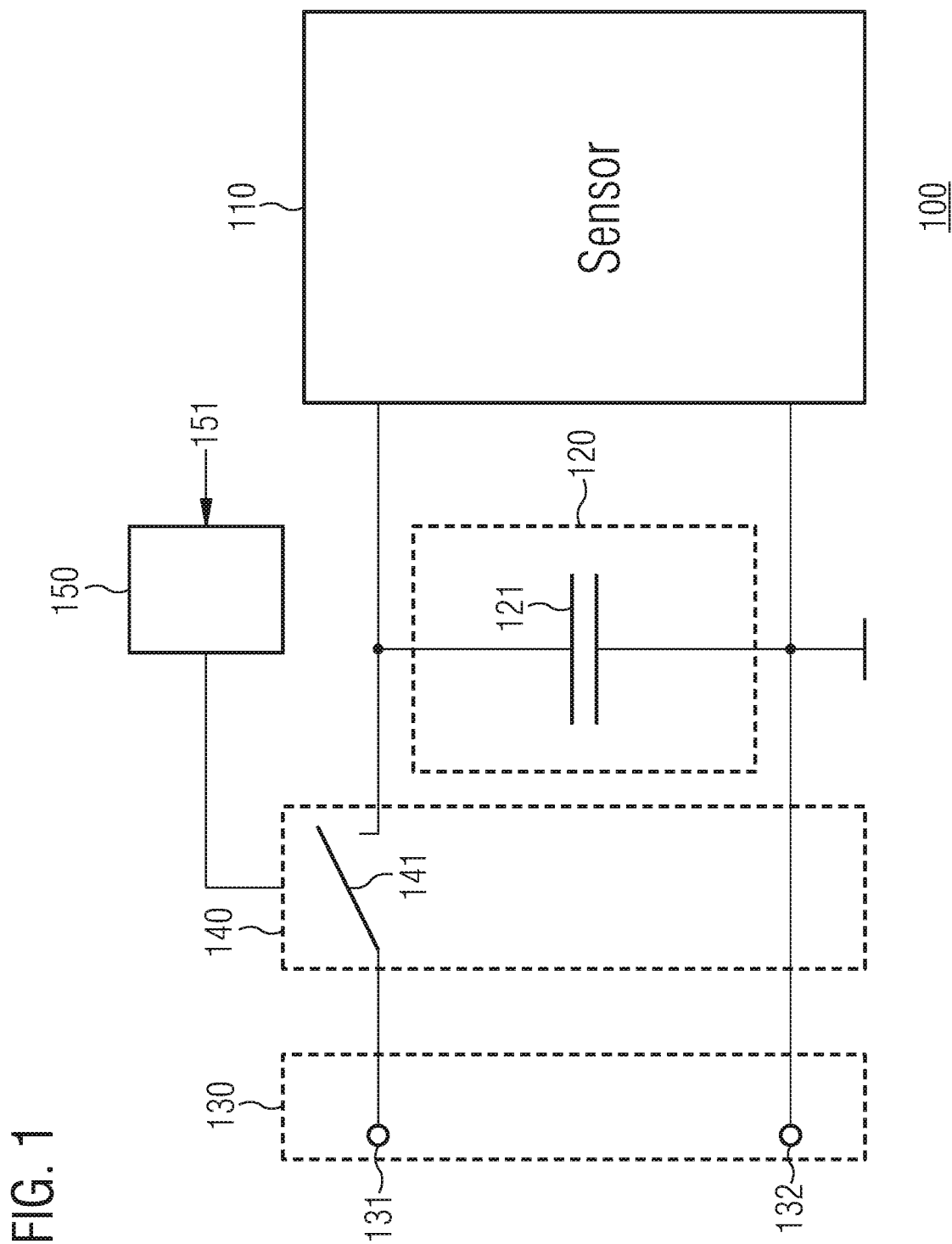
FIG. 1 illustrates an example of a sensor system according to embodiments herein.

FIG. 1 illustrates a sensor system 100 for measuring (sensing) a physical quantity. The sensor system 100 comprises a sensor 110 capable of measuring (sensing) the physical quantity. The physical quantity may be any property of a material (solid, fluid or gaseous) that can be quantified by measurement. For example, the physical quantity also may be a distance, a velocity, a field strength of an electromagnetic field, wireless signal, etc. The sensor 110 comprises measurement circuitry for measuring the physical quantity.

Further, the sensor system 100 comprises a capacitive device 120 for storing electrical energy. The capacitive device 120 is coupled to the sensor 110. The capacitive device 120 serves as a power supply for the sensor 110. The capacitive device 120 exhibits a capacitance $C_{buffer}$. As indicated in FIG. 1, the capacitive device 120 may comprise a single capacitor 121 for storing electrical energy. However, it is to be noted that the capacitive device 120 is not limited thereto. In general, the capacitive device 120 may comprises any number N (with N≥1) of capacitive elements for storing electrical energy. The one or more capacitive elements of the capacitive device 120 may be coupled in parallel and/or in series in order to provide the desired (target) capacitance $C_{buffer}$.

Additionally, the sensor system 100 comprises a power supply input 130 for connecting the sensor system 100 to a SMPS (Switched-Mode Power Supply). As indicated in FIG. 1, the power supply input 130 may comprises two nodes (terminals) 131 and 132 for connecting to corresponding nodes (terminals) of the SMPS providing a respective power supply input voltage to the power supply input 130 and the capacitor 121 when the switch 141 is closed (short circuit or ON). However, it is to be noted that the power supply input 130 is not limited thereto. In general, the power supply input 130 may comprises any number M (with M≥1) of nodes for connecting to the SMPS. When the sensor system 100 is connected to the SMPS, the SMPS may provide electrical energy (power) for the sensor system 100, i.e. the SMPS is capable of supplying electrical energy to the power supply input 130 of the sensor circuit 100.

A switch circuit 140 is coupled between the capacitive device 120 and the power supply input 130. The switch circuit 140 is capable of selectively connecting and disconnecting the capacitive device 120 to/from the power supply input 130. In the example of FIG. 1, the switch circuit 140 comprises a single switch 141 for selectively connecting and disconnecting the capacitive device 120 to/from the power supply input 130. However, it is to be noted that the switch circuit 140 is not limited thereto. In general, the switch circuit 140 may comprise any number K (with K≥1) of switches for connecting and disconnecting the capacitive device 120 to/from the power supply input 130. In some examples, some or all switches of the switch circuit 140 may be a respective semiconductor switch such as a transistor (e.g. a Field-Effect Transistor, FET; a Metal-Oxide-Semiconductor Field-Effect Transistor, MOSFET; etc.), a bidirectional triode thyristor (also known as TRIAC; e.g. for high voltage applications), a relay or a solid-state relay (e.g. for low frequency duty-cycling).

As can be seem from FIG. 1, the sensor 110 is disconnected (decoupled) from the SMPS/power supply input 130 when the capacitive device 120 is disconnected (decoupled) from the SMPS/power supply input 130 by the switch circuit 140.

Operation of the switch circuit 140 is controlled by a control circuit 150. For example, the control circuit 150 may be a single dedicated processor, a single shared processor, or a plurality of individual processors, some of which or all of which may be shared, a Digital Signal Processor (DSP) hardware, an Application Specific Integrated Circuit (ASIC) or a Field Programmable Gate Array (FPGA). The control circuit 150 may optionally be coupled to, e.g., Read Only Memory (ROM) for storing software (e.g. control software for the control circuit 150), Random Access Memory (RAM) and/or non-volatile memory.

The control circuit 150 is operative to control the switch circuit 140 to connect (couple) the capacitive device 120 to the power supply input 130 while the sensor 110 is not measuring the physical quantity in order to charge the capacitive device 120 with electrical energy provided by the SMPS. Furthermore, the control circuit 150 is operative to control the switch circuit 140 to disconnect (decouple) the capacitive device 120 from the power supply input 130 while the sensor 120 is measuring the physical quantity in order to exclusively power the sensor 110 by electrical energy stored in the capacitive device 120 while the sensor 110 is measuring the physical quantity.

That is, the sensor 110 is only connected to the SMPS while the sensor 110 is not measuring the physical quantity. In other words, the sensor 110 is disconnected from the SMPS while the sensor 110 is measuring the physical quantity. Since the sensor 110 is exclusively powered by the electrical energy stored in the capacitive device 120 while the sensor 110 is measuring the physical quantity, the noise of the SMPS does not affect the sensor 110. The sensor circuit 100 is substantially noiseless while the sensor 110 is measuring the physical quantity. Therefore, the sensor circuit 100 may exhibit a high Power Supply Rejection Ratio (PSRR) while the sensor 110 is measuring the physical quantity. The capacitive device 120 serves as a power buffer for the sensor 110. Compared to conventional approaches, the sensor circuit 100 may enable using a SMPS for powering a sensor without the need for a LDO regulator. Compared to conventional approaches using a LDO regulator, the sensor circuit 100 may be more power efficient and, hence, meet the power efficiency requirements for usage in mobile applications (devices).

According to some examples, the control circuit 150 may be operative to receive a status signal 151 indicating whether or not the sensor is (currently) measuring the physical quantity. The status signal 151 may, e.g., be provided by the sensor 110 itself or by another entity (circuitry) controlling operation of the sensor 110. For example, the status signal may exhibit a first logic signal level (e.g. a logic high level or a logic 1) while the sensor 110 is measuring the physical quantity, and a different second logic signal level (e.g. a logic low level or a logic 0) while the sensor 110 is not measuring the physical quantity.

The sensor 110 may, e.g., be duty-cycled. That is, the sensor 110 may be activated during a fraction of a time period for measuring the physical quantity, and be deactivated for the rest of the time period such that the sensor 110 is not measuring the physical quantity during the rest of the time period. Accordingly, the status signal 151 may indicate that the sensor 110 is measuring the physical quantity while the sensor 110 is activated, and that the sensor 110 is not measuring the physical quantity while the sensor 110 is deactivated.

In some examples, while being activated, the sensor 110 may only measure the physical quantity from time to time. For example, the sensor 110 may idle between two consecutive measurements of the physical quantity. Accordingly, the status signal 151 may indicate that the sensor 110 is not measuring the physical quantity during a time period between two consecutive measurements of the physical quantity by the sensor 110.

The sensor 110 may, e.g., be a radar sensor capable of performing radar measurements. Radar sensors are very susceptible to noise. The proposed sensor circuit 100 may allow to shield the radar sensor from the noise of the SMPS such that the radar sensor may be powered by a conventional SMPS without compromising the radar performance of the radar sensor.

For example, in mobile applications, radar sensors are typically duty-cycled. A peak current consumption of the radar sensor may, e.g., be below 200 mA. The radar sensor may, e.g., be activated (operated in the on-mode) for less than 100 µs. When the radar sensor is deactivated (operation in the off-mode), the power consumption of the radar sensor may be assumed to be close to zero.

The capacitive device 120 according to the proposed technology allows to buffer the electrical energy provided by the SMPS for the radar sensor. For example, the SMPS may charge the capacitive device 120 during the off-time of the radar sensor since the radar sensor is not susceptible to the noise of the SMPS during the off-time. During the on-time of the radar sensor, the supply of the SMPS is cut by the switch circuit 140 such that the whole electrical energy required for the operation of the radar sensor is supplied by the capacitive device 120. Since there is no connection to the outside of the sensor system 100 (i.e. to the SMPS) during the on-time of the radar sensor, the proposed circuit is substantially noiseless and shows an extremely high PSRR.

As indicated above in more general words for any sensor, a radar sensor may perform radar measurements only from time to time while being activated. For example, the time periods between consecutive radio frequency emissions (e.g. chirps) in a frame may be long since only low velocities need to be measured. Accordingly, the radar sensor performs only radar measurements during selected fractions of the measurement frame. The energy required for a single radio frequency emission may be buffered by the capacitive device 120 during the time period between the preceding radio frequency emission and the current radio frequency emission. Accordingly, the switch circuit 140 may be controlled to connect the capacitive device 120 to the power supply input 130 (and, hence, to the SMPS) during the time period between two consecutive radio frequency emissions by the radar sensor, and to disconnect the capacitive device 120 from the power supply input 130 during the radio frequency emissions by the radar sensor. For example, the status signal 151 may indicate that the radar sensor is not performing radar measurements during the time period between two consecutive radio frequency emissions (e.g. chirps) by the radar sensor.

Figure 2:
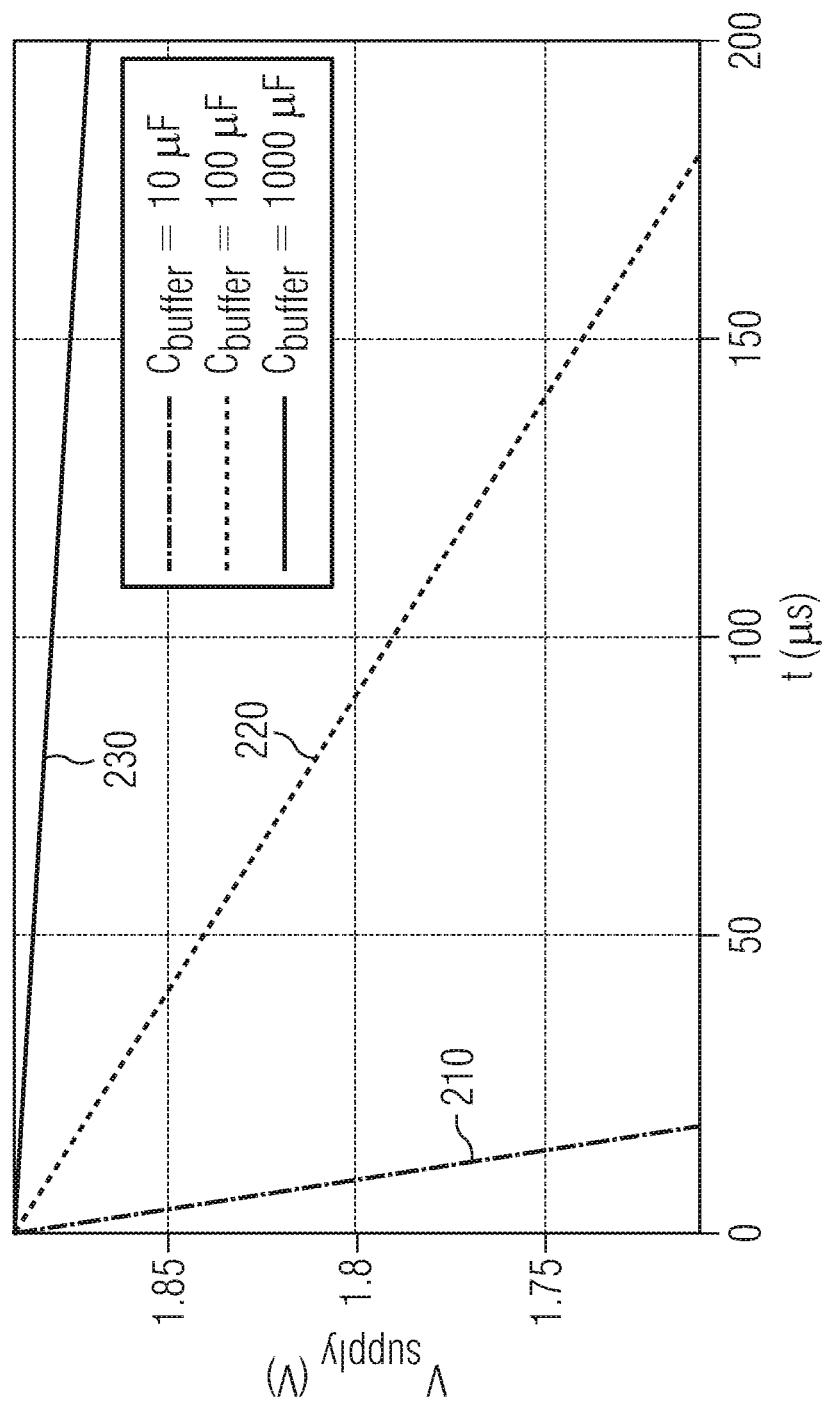
FIG. 2 illustrates exemplary supply voltage drops according to embodiments herein.

FIG. 2 further illustrates three exemplary supply voltage drops over time of the electrical energy provided by the capacitive device 210 for different capacitances $C_{buffer}$ of the capacitive device 120. In the example of FIG. 2, it is assumed that the sensor 110 demands a supply voltage of 1.8V and is able to operate at a maximum supply voltage of $V_{max}$=1.89 V and a minimum supply voltage of $V_{min}$=1.71 V. Furthermore, it is assumed that the sensor 110 constantly draws a current of 100 mA.

Curve 210 represents the supply voltage drop over time for a capacitance $C_{buffer}$=10 µF. Curve 220 represents the supply voltage drop over time for a capacitance $C_{buffer}$=100

µF. Curve 230 represents the supply voltage drop over time for a capacitance $C_{buffer}=1000$ µF.

As can be seen from FIG. 2, the supply voltage stays for 18 µs in the required range for the capacitance $C_{buffer}=10$ µF, 180 µs for the capacitance $C_{buffer}=100$ µF, and much longer for the capacitance $C_{buffer}=1000$ µF.

Already a capacitance $C_{buffer}=100$ µF may, hence, be enough to supply typical sensors. However, it is to be noted that also larger capacitances (e.g. about 500 µF) may be used for supplying a sensor 110 exhibiting a higher current consumption, or for supplying a sensor 110 for a longer period of time. Similarly, smaller capacitances may be used for less power consuming sensors.

Figure 3:
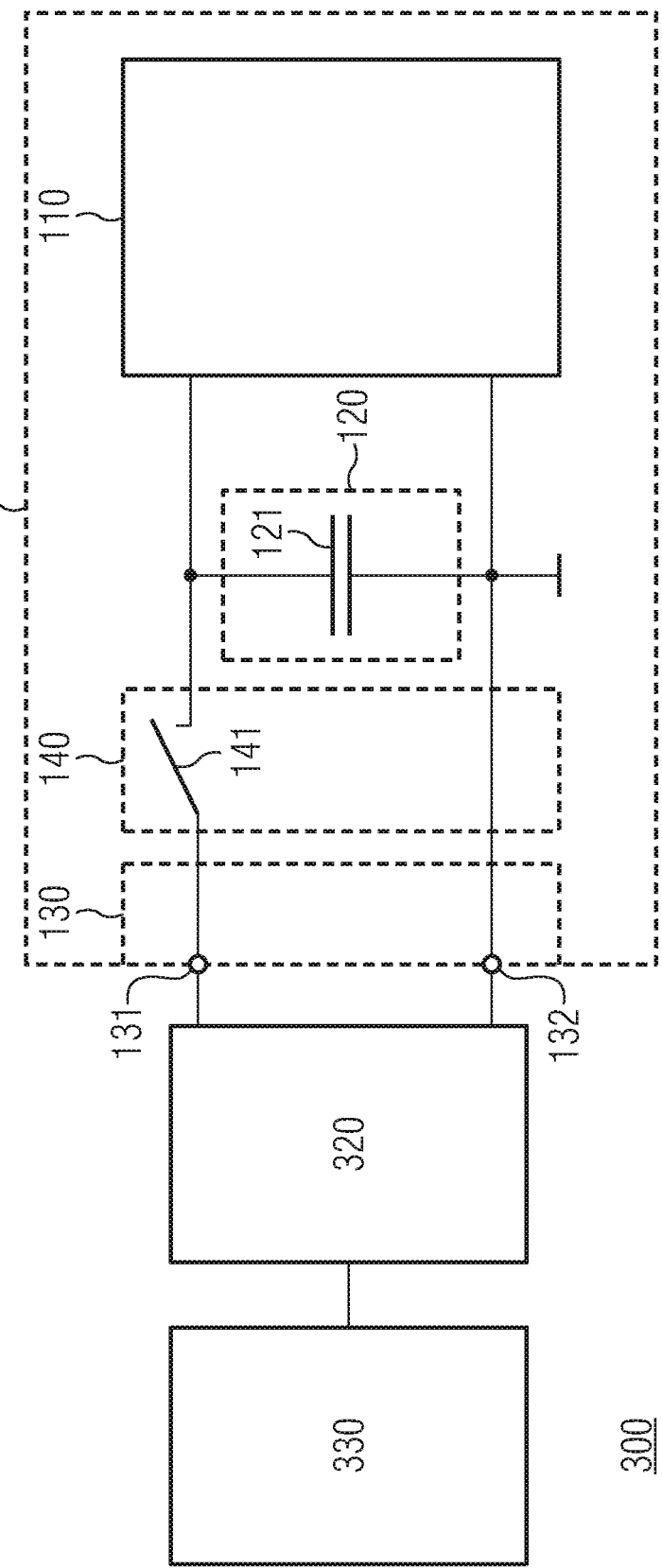
FIG. 3 illustrates an example of an electronic device according to embodiments herein.

An exemplary electronic device 300 using the sensor circuit 100 according to the proposed concept is illustrated in FIG. 3. The electronic device 300 comprises a SMPS 320 connected to the power supply input 130 of the sensor system 100. The SMPS 320 receives electrical power from a power source 330 (e.g. a DC or an AC source) and provides DC power (voltage, or current, etc.) to the power supply input 130 of the sensor system 100. The electronic device 300 may enable efficient power supply for the sensor 110.

The electronic device 300 may be a stationary device or a mobile device. Similarly, the power source 330, may, e.g., be coupled to a power grid or be a battery.

For example, the electronic device 300 may be a mobile device such as a smartphone, a tablet computer or another consumer product. If the sensor 110 is, e.g., a radar sensor, the proposed technology may enable radar functionalities for the mobile device since the limited energy of the mobile device's battery may be efficiently supplied to the radar sensor without compromising the radar performance.

Figure 4:
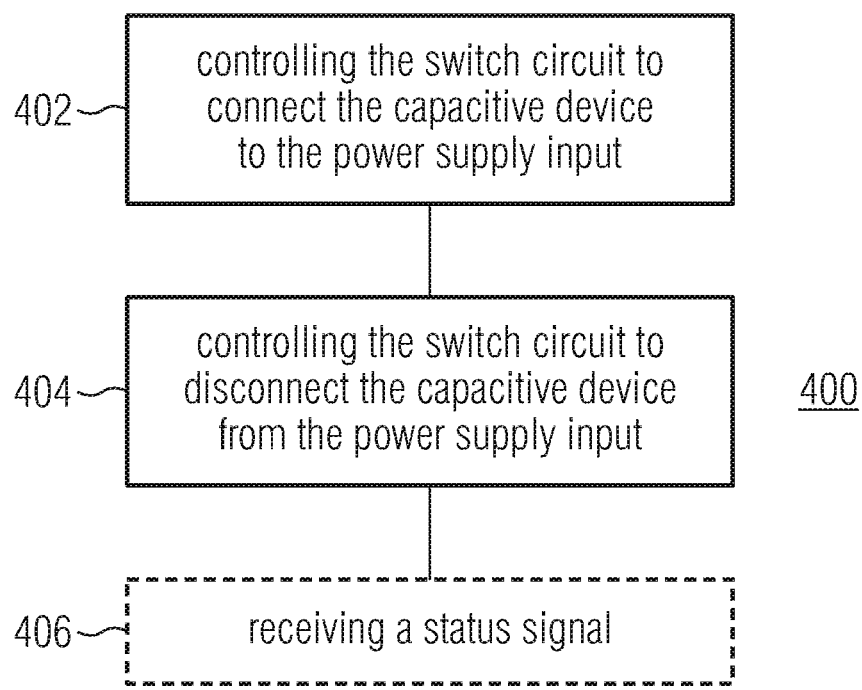
FIG. 4 illustrates a flowchart of an example of a method for operating a sensor system according to embodiments herein.

For further illustrating the power supply technology described above, FIG. 4 illustrates a flowchart of a method 400 for operating a sensor system. As described above, the sensor system comprises a sensor capable of measuring a physical quantity, a capacitive device for storing electrical energy that is coupled to the sensor, a power supply input for connecting the sensor system to a SMPS, and a switch circuit capable of selectively connecting the capacitive device to the power supply input. Method 400 comprises controlling 402 the switch circuit to connect the capacitive device to the power supply input while the sensor is not measuring the physical quantity in order to charge the capacitive device. Additionally, method 400 comprises controlling 404 the switch circuit to disconnect the capacitive device from the power supply input while the sensor is measuring the physical quantity in order to exclusively power the sensor by the capacitive device while the sensor is measuring the physical quantity.

Method 400 may allow to disconnect the sensor from the SMPS while the sensor is measuring the physical quantity such that the noise of the SMPS does not affect the sensor.

Similar to what is described above, the switch circuit may be controlled based on a status signal indicating whether the sensor is measuring the physical quantity. In some examples, method 400 may, hence, further comprise receiving 406 the status signal.

More details and aspects of method 400 are explained in connection with the proposed technique or one or more example embodiments described above (e.g. FIGS. 1 to 3). Method 400 may comprise one or more additional optional features corresponding to one or more aspects of the proposed technique or one or more examples described above.

In the foregoing examples, a conventional SMPS is used and the switching functionality is implemented external from the SMPS. According to the proposed technology, the switching functionality may alternatively be provided within the SMPS itself as will be described in the following with reference to FIGS. 5 to 7.

Figure 5:
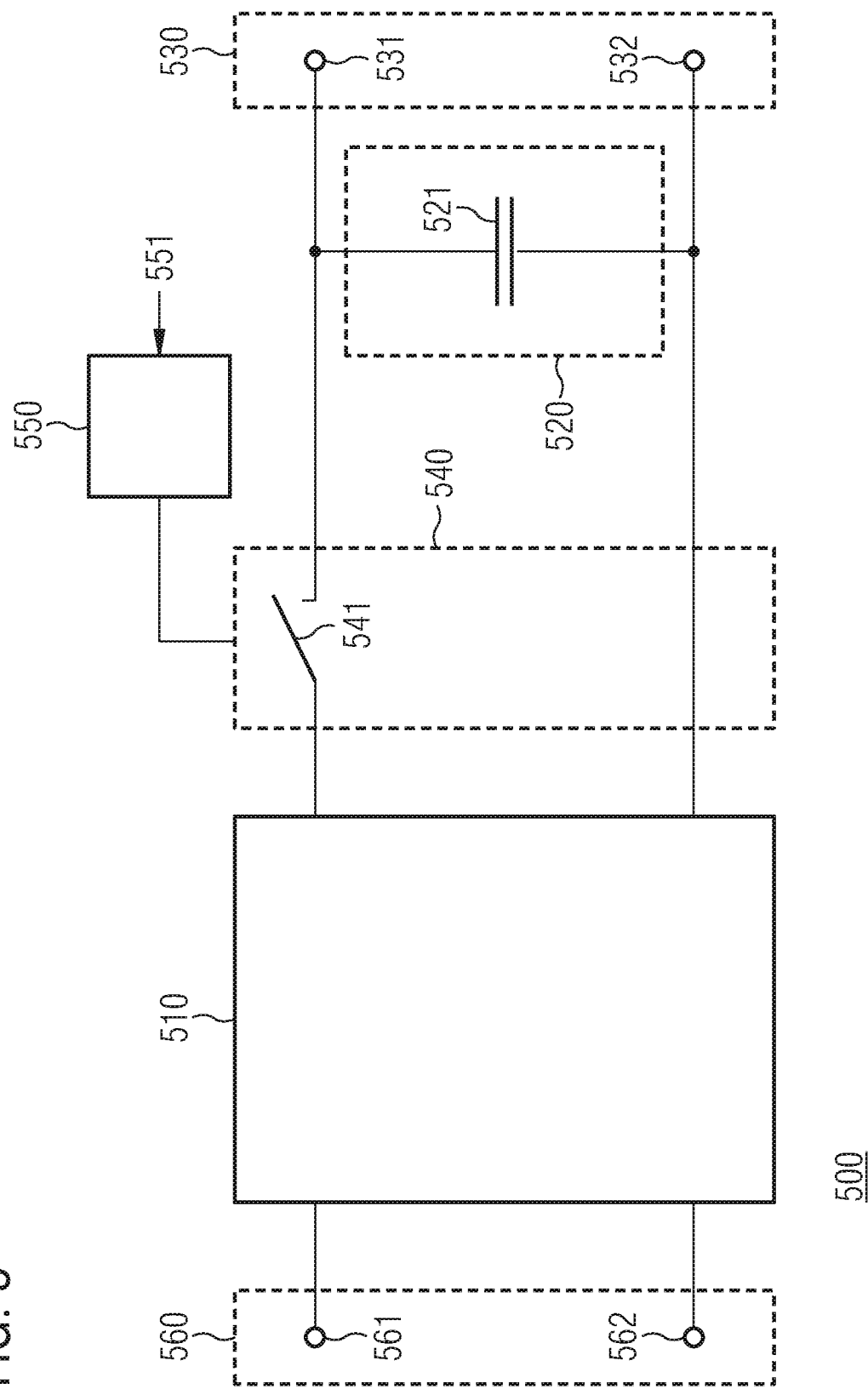
FIG. 5 illustrates an example of a SMPS for a sensor according to embodiments herein.

FIG. 5 illustrates an example of a SMPS 500 for a sensor capable of measuring (sensing) a physical quantity. The SMPS 500 comprises a power supply output 530 for connecting to the sensor and for providing electrical energy (power) to the sensor. As indicated in FIG. 5, the power supply output 530 may comprises two nodes (terminals) 531 and 532 for connecting to corresponding nodes (terminals) of the sensor. However, it is to be noted that the power supply output 530 is not limited thereto. In general, the power supply output 530 may comprises any number R (with R≥1) of nodes for connecting to the sensor.

Further, the SMPS 500 comprises a capacitive device 520 for storing electrical energy. The capacitive device 520 is coupled to the power supply output 530. The capacitive device 520 exhibits a capacitance $C_{buffer}$ and may be implemented like the capacitive device 120 described above.

Additionally, the SMPS 500 comprises power circuitry 510 for providing DC power (e.g. a DC power signal). The SMPS comprises a power supply input 560 for connecting to a power source (e.g. a DC or an AC source). The power circuit 510 is operative to receive via the power supply input 560 electrical power from the power source and to convert it to DC power exhibiting a desired (target) voltage. The power circuitry 510 comprises a switching regulator for power conversion and may comprise additional circuitry such as an input rectifier, filters, an output transformer, an output rectifier, etc.

A switch circuit 540 is coupled between the capacitive device 520 and the power circuitry 510. The switch circuit 540 is capable of selectively connecting and disconnecting the capacitive device 520 to/from the power circuitry 510. In the example of FIG. 5, the switch circuit 540 comprises a single switch 541 for selectively connecting and disconnecting the capacitive device 520 to/from the power circuitry 510. However, it is to be noted that the power switch circuit 540 is not limited thereto. In general, the switch circuit 540 may comprise any number T (with T≥1) of switches for connecting and disconnecting the capacitive device 520 to/from the power circuitry 510. The switch circuit 540 may be implemented like the switch circuit 140 described above.

As can be seem from FIG. 5, the power supply output 530 and, hence, the sensor is disconnected (decoupled) from the power circuitry 510 while the capacitive device 520 is disconnected (decoupled) from the power circuitry 510 by the switch circuit 540.

Operation of the switch circuit 540 is controlled by a control circuit 550. The control circuit 550 may be implemented like the control circuit 150 described above.

The control circuit 550 receives a status signal 551 indicating whether the sensor is measuring a physical quantity. Similar to what is described above, the status signal 551 may, e.g., be provided by the sensor itself or by another entity (circuitry) controlling operation of the sensor.

If the status signal indicates that the sensor is not measuring the physical quantity, the control circuit 550 is operative to control the switch circuit 540 to connect the capacitive device 520 to the power circuitry 510 in order to charge the capacitive device 520 with the DC power provided (output) by the power circuitry 510. If the status signal indicates that the sensor is measuring the physical quantity, the control circuit 550 is operative to control the switch circuit 540 to disconnect the capacitive device 520 from the power circuitry 510 such that the electrical energy provided by the power supply output 530 to the sensor originates exclusively from the capacitive device 520 while the sensor is measuring the physical quantity.

That is, the sensor is only connected to the power circuitry 510 while the sensor is not measuring the physical quantity. In other words, the sensor is disconnected from the power circuitry 510 while the sensor is measuring the physical quantity. Since the sensor is exclusively powered by the electrical energy stored in the capacitive device 520 while the sensor is measuring the physical quantity, the noise of the power circuitry 510 does not affect the sensor. The capacitive device 520 serves as a power buffer for the sensor. Compared to a conventional SMPS, the SMPS 500 may be directly coupled to the sensor without the need for an LDO regulator. Hence, a sensor system made up of the SMPS 500 and the sensor may meet the power efficiency requirements for usage in mobile applications (devices).

Figure 6:
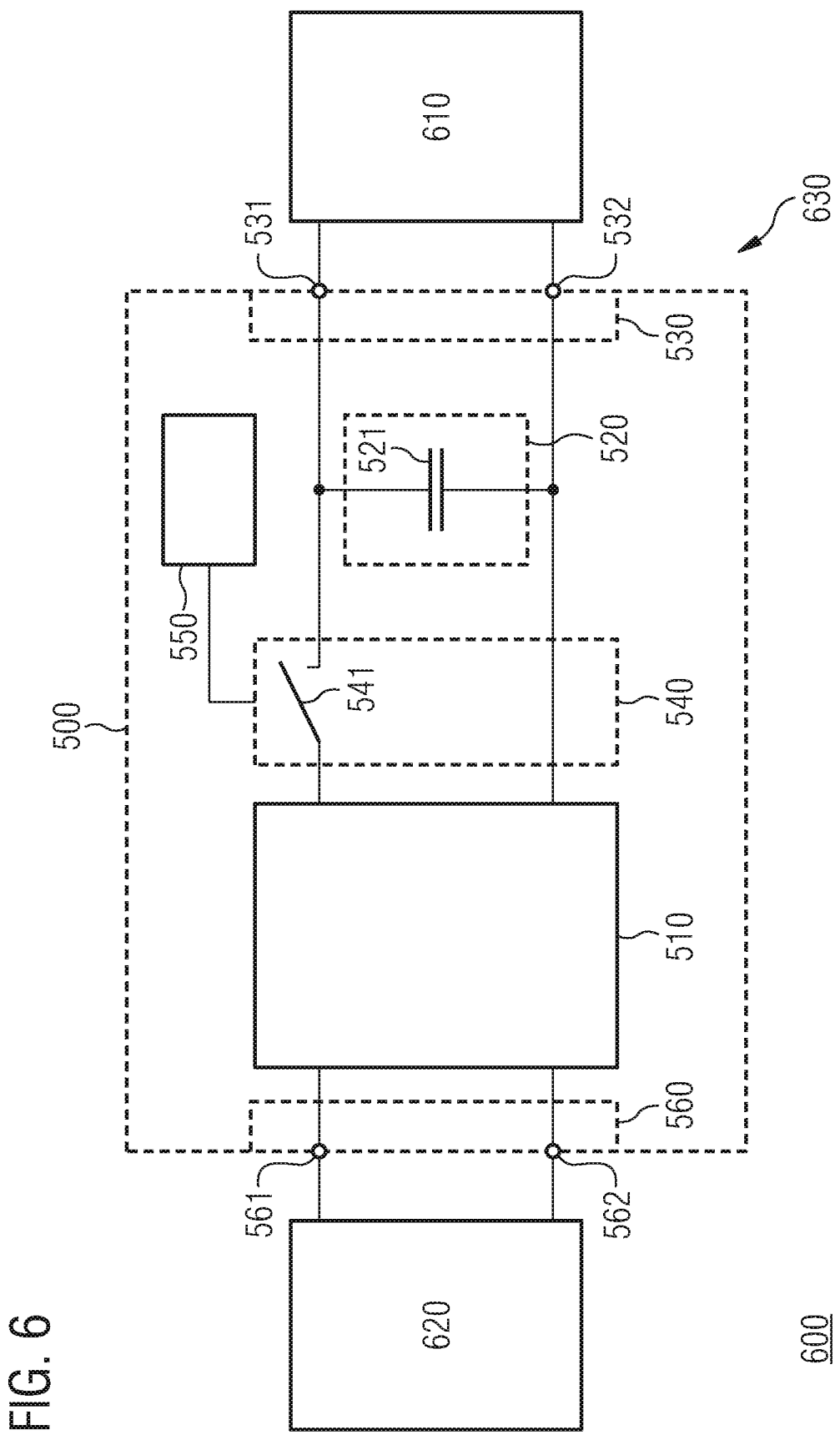
FIG. 6 illustrates another example of an electronic device according to embodiments herein.
Figure 7:
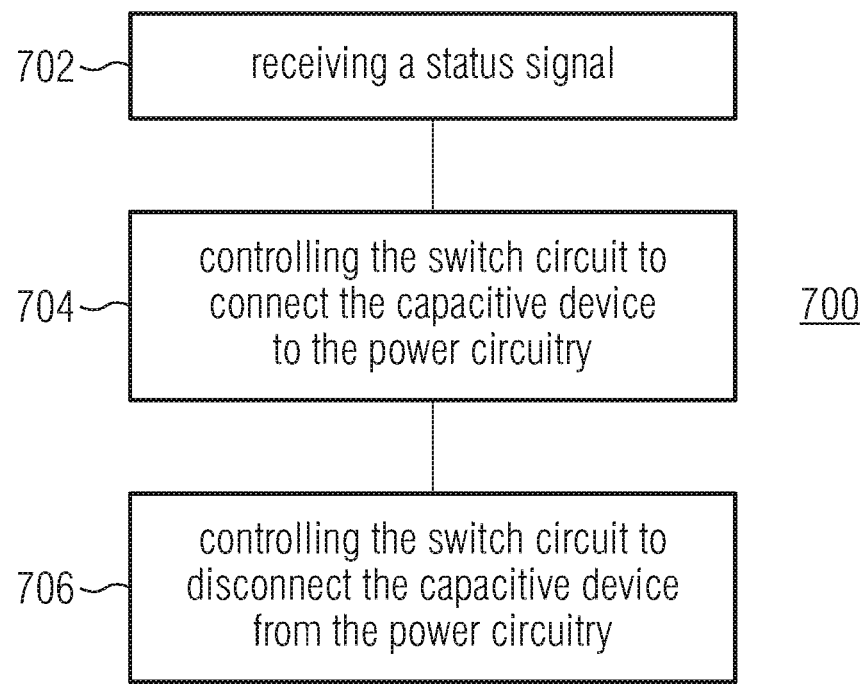
FIG. 7 illustrates a flowchart of an example of a method for operating a SMPS for a sensor according to embodiments herein.

An exemplary electronic device 600 using the SMPS 500 according to the proposed concept is illustrated in FIG. 6. The electronic device 600 comprises a sensor 610 connected to the power supply output 530 of the SMPS 500. The sensor 610 and the SMPS 500 form a sensor system 630.

The power circuitry 510 of the SMPS 500 receives electrical power from a power source 620 (e.g. a DC or an AC source) via the power supply input 560 and provides the DC power for charging the capacitive device 520 of the SMPS 500. The SMPS 500 may enable efficient power supply for the sensor 610.

The electronic device 600 may be a stationary device or a mobile device. Similarly, the power source 620, may, e.g., be coupled to a power grid or be a battery.

For example, the electronic device 600 may be a mobile device such as a smartphone, a tablet computer or another consumer product. If the sensor 610 is, e.g., a radar sensor, the proposed technology may enable radar functionalities for the mobile device since the limited energy of the mobile device's battery may be efficiently supplied to the radar sensor without compromising the radar performance.

For further illustrating the SMPS technology described above, FIG. 7 illustrates a flowchart of a method 700 for operating a SMPS for a sensor. As described above, the SMPS comprises a power supply output for connecting to the sensor and providing electrical energy to the sensor, a capacitive device capable of storing electrical energy, the capacitive device being coupled to the power supply output, power circuitry including a switching regulator for providing DC power, and a switch circuit capable of selectively connecting the capacitive device to the power circuitry. Method 700 comprises receiving 702 a status signal indicating whether the sensor is measuring a physical quantity. Further, if the status signal indicates that the sensor is not measuring the physical quantity, method 700 comprises controlling 704 the switch circuit to connect the capacitive device to the power circuitry in order to charge the capacitive device. If the status signal indicates that the sensor is measuring the physical quantity, method 700 comprises controlling 706 the switch circuit to disconnect the capacitive device from the power circuitry such that electrical energy provided by the power supply output to the sensor originates exclusively from the capacitive device while the sensor is measuring the physical quantity.

Method 700 may allow to disconnect the sensor from the power circuitry of the SMPS while the sensor is measuring the physical quantity such that the noise of the power circuitry does not affect the sensor.

More details and aspects of method 700 are explained in connection with the proposed technique or one or more example embodiments described above (e.g. FIGS. 5 and 6).

Method 700 may comprise one or more additional optional features corresponding to one or more aspects of the proposed technique or one or more examples described above.

The examples as described herein may be summarized as follows:

Some examples relate to a sensor system. The sensor system comprises a sensor capable of measuring a physical quantity. Further, the sensor system comprises a capacitive device for storing electrical energy. The capacitive device is coupled to the sensor. Additionally, the sensor system comprises a power supply input for connecting the sensor system to a SMPS, and a switch circuit capable of selectively connecting the capacitive device to the power supply input. The sensor system comprises a control circuit operative to control the switch circuit to connect the capacitive device to the power supply input while the sensor is not measuring the physical quantity in order to charge the capacitive device. The control circuit is further operative to control the switch circuit to disconnect the capacitive device from the power supply input while the sensor is measuring the physical quantity in order to exclusively power the sensor by the capacitive device while the sensor is measuring the physical quantity.

In some examples, the control circuit is operative to receive a status signal indicating whether the sensor is measuring the physical quantity, wherein the control circuit is operative to control the switch circuit based on the status signal.

According to some examples, the sensor is disconnected from the SMPS while the capacitive device is disconnected from the SMPS by the switch circuit.

In some examples, the sensor is a radar sensor capable of performing radar measurements.

According to some examples, the status signal indicates that the radar sensor is not performing radar measurements during a time period between two consecutive radio frequency emissions by the radar sensor.

Other examples relate to a method for operating a sensor system comprising a sensor capable of measuring a physical quantity, a capacitive device for storing electrical energy that is coupled to the sensor, a power supply input for connecting the sensor system to a SMPS, and a switch circuit capable of selectively connecting the capacitive device to the power supply input. The method comprises controlling the switch circuit to connect the capacitive device to the power supply input while the sensor is not measuring the physical quantity in order to charge the capacitive device. Additionally, the method comprises controlling the switch circuit to disconnect the capacitive device from the power supply input while the sensor is measuring the physical quantity in order to exclusively power the sensor by the capacitive device while the sensor is measuring the physical quantity.

In some examples, the method further comprises receiving a status signal indicating whether the sensor is measuring the physical quantity, and wherein the switch circuit is controlled based on the status signal.

According to some examples, the sensor is disconnected from the SMPS while the capacitive device is disconnected from the SMPS by the switch circuit.

In some examples, the sensor is a radar sensor capable of performing radar measurements.

According to some examples, the status signal indicates that the radar sensor is not performing radar measurements during a time period between two consecutive radio frequency emissions by the radar sensor.

Examples relate to an apparatus for operating a sensor system comprising a sensor capable of measuring a physical quantity, a capacitive device for storing electrical energy that is coupled to the sensor, a power supply input for connecting the sensor system to a SMPS, and a switch circuit capable of selectively connecting the capacitive device to the power supply input. The apparatus comprises means for controlling the switch circuit to connect the capacitive device to the power supply input while the sensor is not measuring the physical quantity in order to charge the capacitive device. In addition, the apparatus comprises means for controlling the switch circuit to disconnect the capacitive device from the power supply input while the sensor is measuring the physical quantity in order to exclusively power the sensor by the capacitive device while the sensor is measuring the physical quantity.

Other examples relate to an electronic device comprising a sensor system as described herein, and a SMPS connected to the power supply input of the sensor system.

In some examples, the electronic device is a mobile device, wherein the mobile device comprises a battery serving as the power source for the SMPS.

Other examples relate to a SMPS for a sensor. The SMPS comprises a power supply output for connecting to the sensor and providing electrical energy to the sensor. Further, the SMPS comprises a capacitive device capable of storing electrical energy. The capacitive device is coupled to the power supply output. Additionally, the SMPS comprises power circuitry including a switching regulator for providing DC power. The SMPS comprises a switch circuit capable of selectively connecting the capacitive device to the power circuitry. In additional, the SMPS comprises a control circuit operative to receive a status signal indicating whether the sensor is measuring a physical quantity. If the status signal indicates that the sensor is not measuring the physical quantity, the control circuit is operative to control the switch circuit to connect the capacitive device to the power circuitry in order to charge the capacitive device. If the status signal indicates that the sensor is measuring the physical quantity, the control circuit is operative to control the switch circuit to disconnect the capacitive device from the power circuitry such that the electrical energy provided by the power supply output to the sensor originates exclusively from the capacitive device while the sensor is measuring the physical quantity.

According to some examples, the power circuitry is disconnected from the power supply output while the capacitive device is disconnected from the power circuitry by the switch circuit.

Still other examples relate to a method for operating a SMPS for a sensor, wherein the SMPS comprises a power supply output for connecting to the sensor and providing electrical energy to the sensor, a capacitive device capable of storing electrical energy, the capacitive device being coupled to the power supply output, power circuitry including a switching regulator for providing DC power, and a switch circuit capable of selectively connecting the capacitive device to the power circuitry. The method comprises receiving a status signal indicating whether the sensor is measuring a physical quantity. Further, if the status signal indicates that the sensor is not measuring the physical quantity, the method comprises controlling the switch circuit to connect the capacitive device to the power circuitry in order to charge the capacitive device. If the status signal indicates that the sensor is measuring the physical quantity, the method comprises controlling the switch circuit to disconnect the capacitive device from the power circuitry such that electrical energy provided by the power supply output to the sensor originates exclusively from the capacitive device while the sensor is measuring the physical quantity.

In some examples, the power circuitry is disconnected from the power supply output while the capacitive device is disconnected from the power circuitry by the switch circuit.

Further examples relate to an apparatus for operating a SMPS for a sensor, wherein the SMPS comprises a power supply output for connecting to the sensor and providing electrical energy to the sensor, a capacitive device capable of storing electrical energy, the capacitive device being coupled to the power supply output, power circuitry including a switching regulator for providing DC power, and a switch circuit capable of selectively connecting the capacitive device to the power circuitry. The apparatus comprises means for receiving a status signal indicating whether the sensor is measuring a physical quantity. Further, the apparatus comprises means for controlling the switch circuit to connect the capacitive device to the power circuitry in order to charge the capacitive device if the status signal indicates that the sensor is not measuring the physical quantity. The apparatus additionally comprises means for controlling the switch circuit to disconnect the capacitive device from the power circuitry if the status signal indicates that the sensor is measuring the physical quantity such that electrical energy provided by the power supply output to the sensor originates exclusively from the capacitive device while the sensor is measuring the physical quantity.

Some examples relate to a sensor system comprising a SMPS as described herein, and a sensor capable of measuring a physical quantity, wherein the sensor is connected to the power supply output of the SMPS.

In some examples, the sensor is a radar sensor capable of performing radar measurements.

Other examples relate to an electronic device comprising a SMPS as described herein, and a sensor capable of measuring a physical quantity, wherein the sensor is connected to the power supply output of the SMPS.

According to some examples, the electronic device is a mobile device, wherein the mobile device comprises a battery serving as power source for the SMPS.

In some examples, the sensor is a radar sensor capable of performing radar measurements.

Further examples relate to a non-transitory machine readable medium having stored thereon a program having a program code for performing one of the methods described herein, when the program is executed on a processor or a programmable hardware.

Still other examples relate to a program having a program code for performing one of the methods described herein, when the program is executed on a processor or a programmable hardware.

Examples of the present disclosure may provide a smart switched power supply in a radar sensor.

The aspects and features mentioned and described together with one or more of the previously detailed examples and figures, may as well be combined with one or more of the other examples in order to replace a like feature of the other example or in order to additionally introduce the feature to the other example.

Examples may further be or relate to a computer program having a program code for performing one or more of the above methods, when the computer program is executed on a computer or processor. Steps, operations or processes of various above-described methods may be performed by programmed computers or processors. Examples may also cover non-transitory program storage devices such as digital data storage media, which are machine, processor or computer readable and encode machine-executable, processor-executable or computer-executable programs of instructions. The instructions perform or cause performing some or all of the acts of the above-described methods. The program storage devices may comprise or be, for instance, digital memories, magnetic storage media such as magnetic disks and magnetic tapes, hard drives, or optically readable digital data storage media. Further examples may also cover computers, processors or control units programmed to perform the acts of the above-described methods or ASICs or (field) programmable logic arrays ((F)PLAs) or (field) programmable gate arrays ((F)PGAs), programmed to perform the acts of the above-described methods.

The description and drawings merely illustrate the principles of the disclosure. Furthermore, all examples recited herein are principally intended expressly to be only for illustrative purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

A functional block denoted as "means for . . . " performing a certain function may refer to a circuit that is operative to perform a certain function. Hence, a "means for s.th." may be implemented as a "means configured to or suited for s.th.", such as a device or a circuit operative to or suited for the respective task.

Functions of various elements shown in the figures, including any functional blocks labeled as "means", "means for providing a signal", "means for generating a signal.", etc., may be implemented in the form of dedicated hardware, such as "a signal provider", "a signal processing unit", "a processor", "a controller", etc. as well as hardware capable of executing software in association with appropriate software. When provided by a processor, the functions may be provided by a single dedicated processor, by a single shared processor, or by a plurality of individual processors, some of which or all of which may be shared. However, the term "processor" or "controller" is by far not limited to hardware exclusively capable of executing software, but may include DSP hardware, a network processor, an ASIC, a FPGA, ROM for storing software, RAM, and non-volatile storage. Other hardware, conventional and/or custom, may also be included.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. A sensor system comprising:
   a sensor operative to measure a physical quantity;
   a capacitive device for storing electrical energy, the capacitive device being coupled to the sensor;
   a power supply input operative to receive power from a switched-mode power supply;
   a switch circuit operative to selectively connect the capacitive device to the power supply input;
   a control circuit operative to control the switch circuit to:
      connect the capacitive device to the power supply input to charge the capacitive device during a first condition in which the sensor is not measuring the physical quantity; and
      disconnect the capacitive device from the power supply input to exclusively power the sensor by a voltage supplied by the capacitive device during a second condition in which the sensor is measuring the physical quantity; and
   wherein the control circuit is operative to receive a status signal indicating the second condition in which the sensor is measuring the physical quantity, and wherein the control circuit is operative to control the switch circuit based on the received status signal.

2. The sensor system of claim 1, wherein the sensor is disconnected from the switched-mode power supply during the second condition in which the capacitive device is disconnected from the switched-mode power supply by the switch circuit.

3. The sensor system of claim 1, wherein the physical quantity includes radar measurement of a radar signal received by the sensor; and wherein the sensor is a radar sensor operative to perform radar measurements.

4. The sensor system of claim 3, wherein the status signal indicates that the radar sensor is not performing radar measurements during a time period between two consecutive radio frequency emissions by the radar sensor.

5. An electronic device, comprising:
   the sensor system according to claim 1; and
   a switched-mode power supply connected to the power supply input of the sensor system.

6. The method as in claim 1, wherein the physical quantity includes radar emissions.

7. The method as in claim 6, wherein the sensor is a radar sensor operative to perform measurements of the radar emissions during the second condition.

8. The method as in claim 7, wherein the second condition corresponds to an emission mode in which the radar sensor emits the radio emissions.

9. The method as in claim 1, wherein the physical quantity measured by the sensor is a strength of a wireless signal.

10. The method as in claim 1, wherein the second condition corresponds to an emission mode in which the sensor emits radio frequency emissions.

11. The method as in claim 1, wherein the sensor is deactivated from measuring the physical quantity during a first portion of a time period; and
wherein the sensor is activated during a second portion of the time period during which the sensor measures the physical quantity.

12. The method as in claim 11, wherein the first portion of the time period corresponds to the first condition during which the sensor does not emit radio frequency emissions; and
wherein the second portion of the time period corresponds to the second condition during which the sensor emits the radio frequency emissions.

13. The method as in claim 12, wherein the capacitive device is operative to store sufficient energy during the first portion of the time period to produce a respective radio frequency emission from the sensor during the second portion of the time period.

14. The method as in claim 1, wherein the capacitive device is operative to store sufficient energy during the first condition to produce a respective radio frequency emission from the sensor during the second condition.

15. The method as in claim 1, wherein the status signal indicates that the sensor is not measuring the physical quantity during the first condition, the first condition being a first mode in which the sensor does not transmit radio emission chirps; and
wherein the status signal indicates that the sensor is measuring the physical quantity during the second condition, the second condition being a second mode in which the sensor transmits radio emission chirps.

16. A method for operating a sensor system comprising a sensor operative to measure a physical quantity, a capacitive device for storing electrical energy, the capacitive device being coupled to the sensor, a power supply input for connecting the sensor system to a switched-mode power supply, and a switch circuit capable of selectively connecting the capacitive device to the power supply input, the method comprising:
controlling the switch circuit to connect the capacitive device to the power supply input to charge the capacitive device during a first condition in which the sensor is not measuring the physical quantity;
controlling the switch circuit to disconnect the capacitive device from the power supply input to exclusively power the sensor by the capacitive device during a second condition in which the sensor is measuring the physical quantity; and
wherein the method further comprises receiving a status signal indicating that the sensor is measuring the physical quantity, and wherein the switch circuit is controlled based on the status signal.

17. The method of claim 16, wherein the sensor is a radar sensor operative to perform radar measurements.

18. A switched-mode power supply for a sensor, the switched-mode power supply comprising:
a power supply output for connecting to the sensor and providing electrical energy to the sensor;
a capacitive device operative to store electrical energy, the capacitive device being coupled to the power supply output;
power circuitry including a switching regulator for providing DC power;
a switch circuit operative to selectively connect the capacitive device to the power circuitry; and
a control circuit operative to:
receive a status signal;
in response to detecting a first condition in which the status signal indicates that the sensor is not measuring a physical quantity, control the switch circuit to connect the capacitive device to the power circuitry to charge the capacitive device; and
in response to detecting a second condition in which the status signal indicates that the sensor is measuring the physical quantity, control the switch circuit to disconnect the capacitive device from the power circuitry such that the electrical energy provided by the power supply output to the sensor originates exclusively from the capacitive device during the second condition in which the sensor is measuring the physical quantity.

19. The switched-mode power supply of claim 18, wherein the power circuitry is disconnected from the power supply output while the capacitive device is disconnected from the power circuitry by the switch circuit.

20. A sensor system, comprising:
the switched-mode power supply according to claim 18; and
the sensor, the sensor operative to measure the physical quantity, wherein the sensor is connected to the power supply output.

21. An electronic device, comprising:
the switched-mode power supply according to claim 18; and
wherein the sensor is connected to the power supply output.

22. The electronic device as in claim 21, wherein the electronic device is a mobile device, and wherein the mobile device comprises a battery serving as a power source for the switched-mode power supply.

23. A method for operating a switched-mode power supply for a sensor, wherein the switched-mode power supply comprises a power supply output for connecting to the sensor and providing electrical energy to the sensor, a capacitive device capable of storing electrical energy, the capacitive device being coupled to the power supply output, power circuitry including a switching regulator for providing DC power, and a switch circuit capable of selectively connecting the capacitive device to the power circuitry, the method comprising:
receiving a status signal indicating whether the sensor is measuring a physical quantity;
in response to detecting that the status signal indicates that the sensor is not measuring the physical quantity, controlling the switch circuit to connect the capacitive device to the power circuitry in order to charge the capacitive device; and
in response to detecting that the status signal indicates that the sensor is measuring the physical quantity, controlling the switch circuit to disconnect the capacitive device from the power circuitry such that electrical energy provided by the power supply output to the sensor originates exclusively from the capacitive device while the sensor is measuring the physical quantity.

* * * * *